US006791324B2

(12) United States Patent  (10) Patent No.: US 6,791,324 B2
Maier et al.  (45) Date of Patent: Sep. 14, 2004

(54) PROBEHEAD AND A SAMPLE SUBSTANCE FOR AN ELECTRON SPIN RESONANCE DOSIMETER

(75) Inventors: Diether Maier, Rheinstetten (DE); Dieter Schmalbein, Burbach (DE); Jin Jie Jiang, Billerica, MA (US); Ralph T. Weber, Watertown, MA (US); Andreas Kamlowski, Karlsruhe (DE); Thomas Schmidt, Rheinstetten (DE)

(73) Assignee: Bruker Biospin GmbH, Rheinstetten-Forchheim (DE)

( * ) Notice: Subject to any disclaimer, the term of this patent is extended or adjusted under 35 U.S.C. 154(b) by 0 days.

(21) Appl. No.: 10/197,629

(22) Filed: Jul. 17, 2002

(65) Prior Publication Data

US 2003/0155921 A1 Aug. 21, 2003

(30) Foreign Application Priority Data

| Feb. 20, 2002 | (DE) | 102 07 723 |
| Feb. 20, 2002 | (DE) | 102 07 717 |
| Feb. 20, 2002 | (DE) | 102 07 722 |
| Feb. 20, 2002 | (DE) | 102 07 718 |
| Feb. 20, 2002 | (DE) | 102 07 711 |

(51) Int. Cl.$^7$ .................................................. G01V 3/00
(52) U.S. Cl. .................................................. 324/316
(58) Field of Search ........................ 324/300, 307–309, 324/316–318, 321–322

(56) References Cited

U.S. PATENT DOCUMENTS

| 3,673,107 A | * | 6/1972 | Peters | 436/58 |
| 5,149,946 A | * | 9/1992 | Jerome et al. | 235/439 |
| 5,212,449 A | * | 5/1993 | Gentsch et al. | 324/316 |
| 6,462,546 B1 | * | 10/2002 | Schmalbein et al. | 324/316 |

FOREIGN PATENT DOCUMENTS

| DE | 39 03 113 C2 | 8/1990 |
| DE | 196 37 471 C2 | 3/1997 |
| JP | 01 138 484 A | 5/1989 |
| JP | 02-173589 | * 5/1990 |
| JP | 02 173 589 A | 7/1990 |

OTHER PUBLICATIONS

W.L. McLaughlin; "ESR Dosimetry"; Nuclear Technology Publishing, vol. 47 No 1/4 1993 pp. 255–262.*
Antonio Bartolotta et al; "Invetigation on Dose Response and Fading Behavior of Ammonium Tartrate–Polyethylene Solid State ESR Dosimeters"; IEEE 2000; pp. 2086–2088.*
Andrzej Francik; "The Microwave Autodyne Gunn Oscillator as a Simple Detector of EPR Signal for Food–Irradiation Dozymeter"; pp. 103–106.*
Standard Practice for Use of the Alanine–EPR Dosimetry System, American Society For Testing and Materials of the Annual Book of ASTM Standards, pp. 1–7.
"ESR Spectrometer Accessories Glassware", Magnettech GmbH Pricelist, Jan. 1, 2002, pp. 1–22.
Olsson et al., "Calibration of Alanine Dosimeters", Oct. 11, 2001, pp. 1–25.

* cited by examiner

Primary Examiner—Christopher W. Fulton
Assistant Examiner—Dixomara Vargas

(57) ABSTRACT

A probehead for an electron spin resonance (ESR) dosimeter comprises a resonator and an insert extending into the resonator. The insert has a guide channel for bringing a sample into the resonator. The sample comprises a dosimeter substance. The guide channel is configured for receiving and guiding a test strip. The insert is provided with a first machine-readable code imprint. The insert is provided with at least one reference sample. A pressurized air unit is provided for blowing the sample out of the resonator after completion of a measurement. The insert has an opening on an upper side of the resonator. The opening is openly accessible for manually inserting dosimeter pills thereinto. The insert, further, is provided on the upper side with a pressurized air connector. The pressurized air connector is connected to an orifice via a pressurized air channel within the insert. The orifice is located within a lower, otherwise closed bottom of the guide channel. The sample substance comprises a chromium-doped magnesium oxide (Cr:MgO). The magnesium oxide is doped with the isotope $^{52}$Cr.

44 Claims, 6 Drawing Sheets

PROBEHEAD AND A SAMPLE SUBSTANCE FOR AN ELECTRON SPIN RESONANCE DOSIMETER

FIELD OF THE INVENTION

The present invention, generally, relates to the field of electron spin resonance (ESR) dosimetry.

More specifically, the invention relates to a probehead for an electron spin resonance dosimeter reader, comprising a resonator and an insert extending into the resonator having a guide channel for bringing a sample into the resonator, the sample comprising a dosimeter substance.

Still more specifically, the invention relates to a probehead for an electron spin resonance dosimeter, comprising a resonator, an insert extending into the resonator having a guide channel for bringing a sample into the resonator, the sample comprising a dosimeter substance, and a pressurized air unit for blowing the sample out of the resonator after completion of a measurement.

Moreover, the invention is related to a sample substance for an electron spin resonance dosimeter, comprising a chromium-doped magnesium oxide (Cr:MgO).

BACKGROUND OF THE INVENTION

A probehead of the type of interest in the present context is disclosed in document JP 01 138 484 A.

In the industrial practice, it becomes more and more customary to irradiate products of any kind. For example, various products are irradiated for disinfection purposes or for increasing their durability, respectively. A typical example is the field of hygiene articles, for example baby's diapers. During production, such diapers are packed in batches and are then irradiated batch by batch in order to put them at the customer's disposal in a germ-free condition. It is common practice to convey the articles to be irradiated batch by batch past a source of irradiation, wherein several passes may be provided in order to achieve a predetermined dose of irradiation.

Further, it is a well-established practice to irradiate products and articles in order to exterminate unwanted organisms. In practice this happens for example in connection with food-stuffs, for example spices which are sometimes affected by pathogenic germs and, prior to being processed and distributed, must be treated accordingly.

Still another field of application is the prophylactic irradiation of articles of many kinds in connection with the use of biologic warfare agents if, for example, pieces of mail must be treated as a precautionary measure, because it must be expected that certain pieces of mail containing pathogenic germs are mailed in connection with terrorist attacks.

In all these and many other applications of irradiation, it is, however, desired to properly measure the amount of irradiation and, as the case may be, to document same. This holds true basically independent of the kind of irradiation (gamma rays, electron rays, etc.).

For that purpose, corresponding measuring instruments, dosimeter substances, packaging methods for dosimeter substances and pertinent standards have been developed under the general term "dosimetry". In the U.S., for example, the American Society for Testing and Materials has developed and published a standard E 1607-96 "Standard Practice for Use of the Alanine-EPR Dosimetry System". Dosimetry methods are today certified by various official and other institutions. For that purpose, it is necessary to be able to follow-back measuring samples, i.e. to provide a complete documentation.

Conventional dosimeters, as are used, for example, for protecting people in installations where work is done with rays of various kinds, essentially consist of a section of a normal commercial photographic film which becomes blackened under the action of an irradiation. The film sections are developed after a certain period of time has lapsed, and are then evaluated optically, wherein the amount of blackening of the film is a measure for the irradiation dose received. Such film dosimeters are still today used on a broad scale in connection with the measurement of irradiation doses in industrial irradiation processes.

Film dosimeters, however, have the disadvantage that they are relatively complicated in their handling and evaluation. Further, one has found out that they are not stable over an extended period of time. A fast and reliable measurement of irradiation values is, therefore, as much impossible as a long term storage and documentation of the original dosimeters. Finally, the behavior of a photographic film in the present context does not correspond to the behavior of organic tissue being subjected to an irradiation.

Therefore, conventional film dosimeters have increasingly been replaced by so-called alanine dosimeters. In this type of dosimeter, the dosimeter substance consists of alanine, i.e. an amino acid, the behavior of which, for example with respect to gamma rays, corresponds to that of organic tissue to a far more extent as is the case for conventional film dosimeters. In the art, alanine dosimeters are, therefore, referred to by the term "tissue equivalent". Alanine, moreover, is very stable over an extended period of time, so that irradiated alanine may be again measured after a long period of time has lapsed, without any information having gone lost. Typically, doses of irradiation of interest in the present context are within the range of between 400 Gy (Gray) and 100 kGy (Kilogray).

As already mentioned above in connection with a standard established in the U.S., alanine dosimeters are conventionally measured and evaluated by utilizing the technique of electron paramagnetic resonance (EPR), also referred to as electron spin resonance (ESR). This is because when alanine is irradiated, so-called "free radicals" are generated, which, in the course of an ESR measurement, show a characteristic spectrum in which the amplitude of the primary line within the spectrum is representative for the dose of irradiation.

Document DE 196 37 471 C2 discloses a dosimeter substance, an alanine dosimeter as well as a method for their production. In this context it is disclosed that alanine dosimeters may be configured for utilizing pill- or film-shaped alanine elements of various geometry.

Document DE 39 03 113 C2 discloses a dosimeter as used for persons working in an irradiation-protected area. Likewise, alanine pills are used as dosimeter substance. The dosimeter itself consists of a small frame-shaped assembly having a corresponding chamber for receiving the alanine pills.

Document JP 02 173 589 A discloses still another dosimeter which is adapted to be evaluated by means of ESR. The dosimeter substance in that case has the shape of a strip and is applied to a small frame-shaped assembly.

Document JP 01 138 484 A mentioned at the outset, discloses a probe feed apparatus for ESR dosimeters. In this prior art apparatus, rod-shaped dosimeter elements are inserted into corresponding, axially extending recesses within a rotating disc, the rotation of which is controlled by means of optical sensors. The rotating disc is located above an ESR sample chamber. By rotating the disc accordingly, various dosimeter elements may be positioned above the ESR sample chamber one after the other and may then be lowered thereinto, where they are held in a reference position by means of appropriate holding elements.

Pressurized air may be fed to the sample chamber from its lower side in order to be able to blow the dosimeter element out of the sample chamber after completion of the ESR measurement.

During an ESR measurement, the ESR signal is measured as an electric mistuning of a resonator housing the sample under investigation. During the resonance transition, the sample absorbs energy and, hence, the resonator, having been tuned before, becomes mistuned. For that purpose, the external magnetic field acting on the resonator is conventionally swept slowly so that depending on the sample material and the complexity of the ESR spectrum, one or more resonance lines are generated.

Classical ESR spectrometry is limited in this context to the analysis of the particular appearance of the spectrum, i.e. the number, position and shape of the spectral lines which are recorded and analyzed. Although signal intensity plays a certain roll in that regard, conventional ESR spectrometers do not allow to measure signal intensity in absolute values. The reason is that the signal amplitude as an absolute value does not only depend on process parameters which may be set reproducibly, for example microwave frequency, the irradiated microwave energy, the scanning modulation amplitude, etc., but also from the type of sample, in particular its dielectric losses, the resonator tuning, the type of resonator used, etc.

In contrast, ESR dosimetry requires that the signal of the sample comprising the dosimeter substance be determined absolutely, namely with an accuracy of between 1 and 2%. This is impossible with conventional ESR spectrometers.

In another area of magnetic resonance, namely in the area of nuclear resonance (NMR), it is known to measure absolute signal amplitudes by concurrently measuring the sample under investigation and a so-called "standard", for example tetramethylsilane (TMS). These "standards" may either be mixed with the sample under investigation (so-called "internal standard"), or they may be arranged separately within the probehead (so-called "external standard"), as the case may be. If the resonance behavior and, in particular, the amplitude of the reference material signal is predetermined, then the signal of the sample under investigation may be calibrated by comparing amplitudes.

In the context of investigations of solids, in particular of doped solids by means of electron spin resonance, one has to a large extent also made investigations on magnesium oxide with various dotations or contaminations, respectively, for example electron spin resonance of $Cr^{3+}$ in MgO. In that context one has also investigated substances in which the chromium ions were present as the isotope $^{53}Cr$. In that case, an isotopic spectrum with particular hyperfine structure was obtained, i.e. a structure having a plurality of spectral lines.

It is, therefore, an object underlying the present invention to improve a probehead of the type specified at the outset, such that the afore-mentioned disadvantages are avoided.

In particular, the invention shall make it possible to provide a probehead for an ESR dosimeter allowing a processing of irradiated dosimetry strips in a faster and safer way. In particular, it shall become possible to individually identify dosimeter strips so that a proper documentation of the measurement results is possible, as is described for certain certification processes.

Still another object underlying the invention is to enable measurements of absolute values quickly and easily so that the irradiation dose may be reliably measured and documented.

According to another object underlying the invention, an ESR dosimeter shall be provided allowing to process irradiated dosimeter pills quickly and safely, wherein also a manual supply of dosimeter pills to the probehead shall be possible, even by non-skilled persons.

Finally, it is an object underlying the present invention to provide a sample substance of the type specified at the outset such that the afore-mentioned disadvantages are avoided.

In particular, the invention shall enable to provide a reference substance for the electron spin resonance dosimetry having only one single characteristic line within the ESR spectrum having a sufficient distance from the resonance of the free electron (g=2) and the ESR behavior of which corresponding essentially to the behavior of the sample under investigation containing the dosimeter substance.

SUMMARY OF THE INVENTION

These and other objects are achieved according to the present invention by a probehead for an electron spin resonance dosimeter, comprising a resonator, and an insert extending into the resonator and having a guide channel for bringing a sample into the resonator, the sample comprising a dosimeter substance, wherein the guide channel is configured for receiving and guiding a test strip.

By guiding the test strip, the test strip will always be located at a predetermined reference position during the ESR measurement so that the measurement is made under reproducible conditions. This enables faster and safer measurements.

In a preferred embodiment of the inventive probehead, the test strip consists of a carrier material, and the carrier material is coated with the dosimeter substance at least over a section thereof.

This measure has the advantage that the test strip may be utilized for various functions.

This holds true in particular when, according to a further embodiment of the invention, the test strip is provided with a first machine-readable code imprint.

This measure has the advantage of a reliable identification of any test strip with conventional means, for example with a commercially available bar code reader.

It is particularly preferred in that context when, further, the insert is provided with a second machine-readable code imprint.

This measure has the advantage that not only each individual test strip may be automatically identified. Moreover, the particularly used test strip may be allocated to the particularly used insert so that the ESR measurement may be documented extensively.

For that purpose, it is preferred when the code imprints are located side by side when the test strip is inserted into the guide channel, wherein the insert is configured optically transparent at least in the area of the first code imprint.

This measure has the advantage that both code imprints may simultaneously be read by means of the same optical reader. Insofar, compact structures become possible.

According to still another preferred embodiment of the invention, the first code imprint is readable by means of a code reader only when the test strip is in a predetermined position and in a predetermined orientation within the guide channel.

For that purpose, the optically transparent area is located such that the first code imprint can be read only when the test strip is in a predetermined position and in a predetermined orientation within the guide channel.

According to still another embodiment of the invention, the guide channel is provided with a stop for the test strip which can preferably be configured by the lower terminal end of the vertically extending guide channel.

These measures have the advantage, that measurements may be executed extremely simply by manually feeding the insert with test strips. The user of the inventive probehead needs only to insert the test strip from above into the guide channel. When the guide channel extends vertically, the test strip will fall downwardly under the action of gravity, until it comes to rest at the stop with its lower terminal end, namely at the lower bottom of the guide channel. In any event, the test strip has then assumed its predetermined reference position within the probehead.

The above approach may still further be improved as well for manual as well as for automatic operation when the guide channel is provided with an insertion assisting means for the test strip.

According to further embodiments of the invention, the insert is provided with at least one reference sample, the reference sample being positioned within the insert such that it is located in the area of the section coated with the dosimeter substance, when the test strip is inserted into the guide channel.

This measure has the advantage that absolute measurements on test strips become possible because the signal intensity of the dosimeter substance comprised in the measuring sample may be converted into absolute values when their signal is compared to the predetermined signal of the reference sample and an appropriate ratio is computed.

Within the scope of the present invention, it is particularly preferred to use alanine as dosimeter substance.

The objects underlying the invention are, further, solved by a probehead for an electron spin resonance dosimeter, comprising a resonator, and an insert extending into the resonator and having a guide channel for bringing a sample into the resonator, the sample comprising a dosimeter substance, wherein the insert is provided within a first machine-readable code imprint.

If, namely, the insert is provided with a corresponding code imprint, various information may be detected during the measurement and may be stored together with the measurement result of the measuring probe. This type of information comprises, for example, information about the type, size, etc. of the particularly used insert, information about ESR spurious or base signals coming from the insert and being unavoidable to a certain extent, which signals will also be generated during the later ESR measurement but can be eliminated from the measurement on the measuring probe by appropriate computation if these spurious or based signals are known. Finally, the code imprint may provide information about a reference sample integrated into the insert.

In a preferred embodiment of the invention, a code reader is associated to the first code imprint.

This measure has the advantage that commercially available instruments may be used at low cost.

In a further embodiment of the invention, the sample is provided with a second machine-readable code imprint.

This measure has the advantage that not only characteristic values of the insert but also values of the sample itself may be read prior to the measurement and correspondingly stored. This allows a still more complete documentation of any parameters possibly influencing the measurement.

The object underlying the invention is further solved by a probehead for an electron spin resonance dosimeter, comprising a resonator, and an insert extending into the resonator and having a guide channel for bringing a sample into the resonator, the sample comprising a dosimeter substance, wherein the insert is provided with at least one reference sample.

By utilizing a reference sample with an ESR signal of predetermined amplitude, the absolute value for the measuring probe may be determined by comparing the ESR signal of the reference sample on the one hand and of the measuring probe comprising the dosimeter substance, on the other hand. Therefore, via measuring the reference sample, the dose of the irradiation exerted on the measuring sample may be determined with sufficient precision of, for example, 1 to 2%.

In a preferred embodiment of the inventive probehead, the reference sample is positioned within the insert such that it is located in the area of the volume of the sample to be measured, when the sample is inserted into the guide channel.

This measure has the advantage that the measuring conditions become reproducible because the measuring sample on the one hand and the reference sample on the other hand are located at approximately the same location within the probehead and, hence, within the resonator, so that the measuring conditions for both samples are practically identical.

This holds true in particular when the guide channel extends vertically within the insert, and a stop for the sample is provided at the lower terminal end of the guide channel, and the reference sample is arranged in the area of that stop.

This measure enables in particular to feed the inventive probehead with the dosimeter substance manually because it must only be inserted from above into the guide channel for then automatically falling downwardly under the action of gravity into the area of the stop. This corresponds to a precise reference position.

In this context, it is further preferred when the reference sample generates an ESR signal having a spectral position distant from the ESR signal of the dosimeter substance.

This measure has the advantage that both signals may be clearly separated one from the other and, hence, both signals may be evaluated without interfering with each other.

It is, further, particularly preferred when the reference sample generates an ESR signal having a microwave saturation behavior corresponding to the microwave saturation behavior of the dosimeter substance. The same applies, mutatis mutandis, for the line width, i.e. the modulation saturation behavior, as well as for the temperature coefficient.

All these measures have the common advantage that with a similar ESR measuring behavior, no error is generated when the measuring conditions are altered which would result in different reactions for the measuring sample on the one hand and the reference sample on the other hand, if their behavior were different.

The object underlying the invention is, further, solved by a probehead for an electron spin resonance dosimeter, comprising a resonator, an insert extending into the resonator and having a guide channel for bringing a sample into the resonator, the sample comprising a dosimeter substance, and a pressurized air unit for blowing the sample out of the resonator after completion of a measurement, wherein the insert has an opening on an upper side of the resonator, the opening being openly accessible for manually inserting dosimeter pills thereinto, the insert, further, being provided on the upper side with a pressurized air connector, the pressurized air connector being connected to an orifice via a pressurized air channel within the insert, the orifice being located within a lower, otherwise closed bottom of the guide channel.

With this assembly, even unskilled persons are in a position to insert irradiated dosimeter pills which are supplied to them into the openly accessible opening from which the pills are automatically, i.e. under the action of gravity, conveyed to their measurement position where they may then be measured automatically. After completion of the measurement, the measured dosimeter pills are then disposed off automatically by feeding pressurized air and may, accordingly, be guided to a collecting means in which the dosimeter pills are, for example, packed, marked and documented.

As the probehead according to the present invention has all inputs, outputs and connectors located on the upper side of the resonator, the probehead may be utilized on commercially available ESR resonators, without the need of modifying the resonator or even the magnet system in which the resonator is located. Moreover, the guide- or convection system for the samples is closed in itself, so that the interior of the resonator is protected against ingression of dust.

According to a preferred embodiment of the invention, the guide channel has a rectangular cross-section.

This measure has the advantage that a form-fitting guide for the dosimeter pills is provided within the channel so that reproducible measuring conditions may be guaranteed.

This holds true in particular when the opening is configured as a slot.

This has the advantage that the dosimeter pills fed to the insert become oriented already during their insertion into the opening being openly accessible from above.

According to still another improvement of the invention, the opening is arranged at a lateral distance from the guide channel, and has a transition to the guide channel via a chamfered guide means.

This measure has the advantage that the opening is very well accessible laterally so that dosimeter pills may be fed manually without problems. The chamfered guide in the transition between the opening in the guide channel guarantees that the dosimeter pills will not become stuck but will safely come to their measurement position.

In still another group of embodiments, the guide channel has an upper end and a transition into a blow-out channel at the upper end, in particular a 180° elbow.

These measures have the advantage that the trajectory of the blown-out dosimeter pills is well-defined. Further, the flush arrangement between the guide channel and the blow-out channel has the advantage that the dosimeter pills will safely fly from the guide channel into the blow-out channel during the blowing-out.

Furthermore, certain embodiments of the invention preferably provide for a reference sample located essentially at the bottom of the insert, wherein also two reference samples with distinct gyromagnetic ratios may be provided essentially at the bottom.

This measure has the advantage that quantitative measurements, i.e. calibrated amplitude measurements, may be conducted on the dosimeter pills.

The object is, finally, also solved by a sample substance for an electron spin resonance dosimeter, comprising a chromium-doped magnesium oxide (Cr:MgO), wherein the magnesium oxide is doped with an isotope $^{52}$Cr.

In the context of the present invention, one has, namely, surprisingly found that $^{52}$Cr:MgO has only one single explicit ESR resonance line being sufficiently distant from g=2 and, further, having ESR properties corresponding essentially to those of the conventional dosimeter substance alanine. This relates to a comparable line width (i.e. modulation saturation behavior), a comparable microwave saturation behavior, a comparable temperature coefficient, an isotropic behavior, etc.

Although the pertinent literature has already reported on ESR investigations on chromium-doped magnesium oxide, one has never found on Cr:MgO nor on $^{53}$Cr:MgO, also described in the literature, that an ESR spectrum has one single explicit line. In contrast, one has measured an explicit hyperfine structure, i.e. the exact contrary, on $^{53}$Cr:MgO. Moreover, it cannot be taken from the measurements described in the literature that chromium-doped magnesium oxide has similarities with alanine, i.e. an amino acid, for what concerns the ESR behavior.

In a preferred embodiment of the invention, the isotope $^{52}$Cr is used in an isotope-pure abundance (>95%).

Furthermore, it is preferred when the fraction of the isotope $^{52}$Cr within the doped magnesium oxide $^{52}$Cr:MgO is between 0.05 and 0.15%.

These values have shown to be very advantageous in practice.

In a nutshell, the invention comprises the use of $^{52}$Cr:MgO as a reference substance for the electron spin resonance dosimetry.

Further advantages will become apparent from the description and the enclosed drawing.

It goes without saying that the afore-mentioned features and those that will be explained hereinafter, may not only be used in the particularly given combination, but also in other combinations, or alone, without leaving the scope of the present invention.

BRIEF DESCRIPTION OF THE DRAWINGS

Embodiments of the invention are depicted in the drawing and will be described in further detail throughout the subsequent description.

DETAILED DESCRIPTION OF THE PREFERRED EMBODIMENTS

Figure 1:
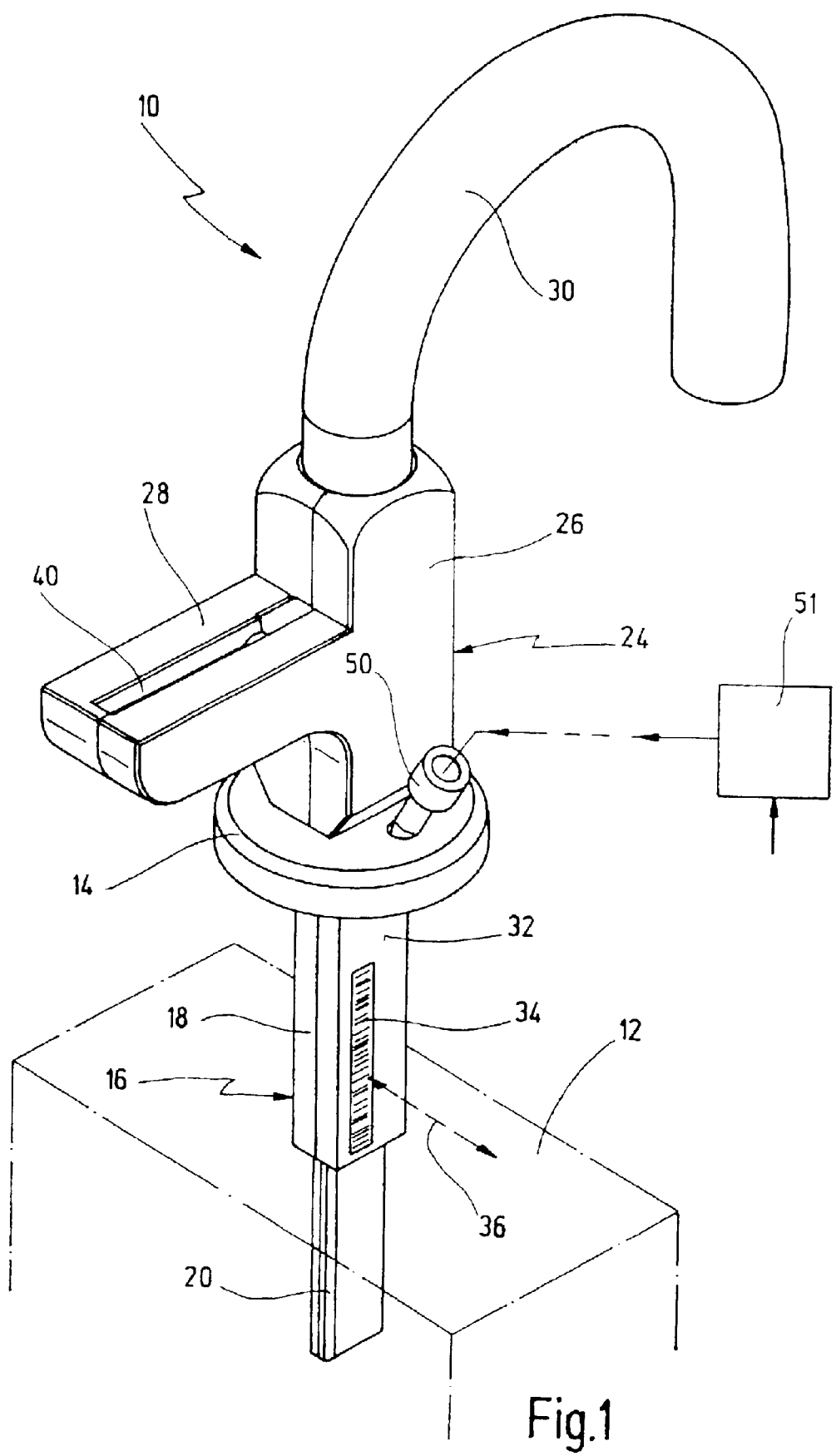
FIG. 1 is a perspective view on a first embodiment of an insert for an electron spin resonance (ESR) spectrometer, adapted to be used for pill-shaped alanine dosimeters.
Figure 2:
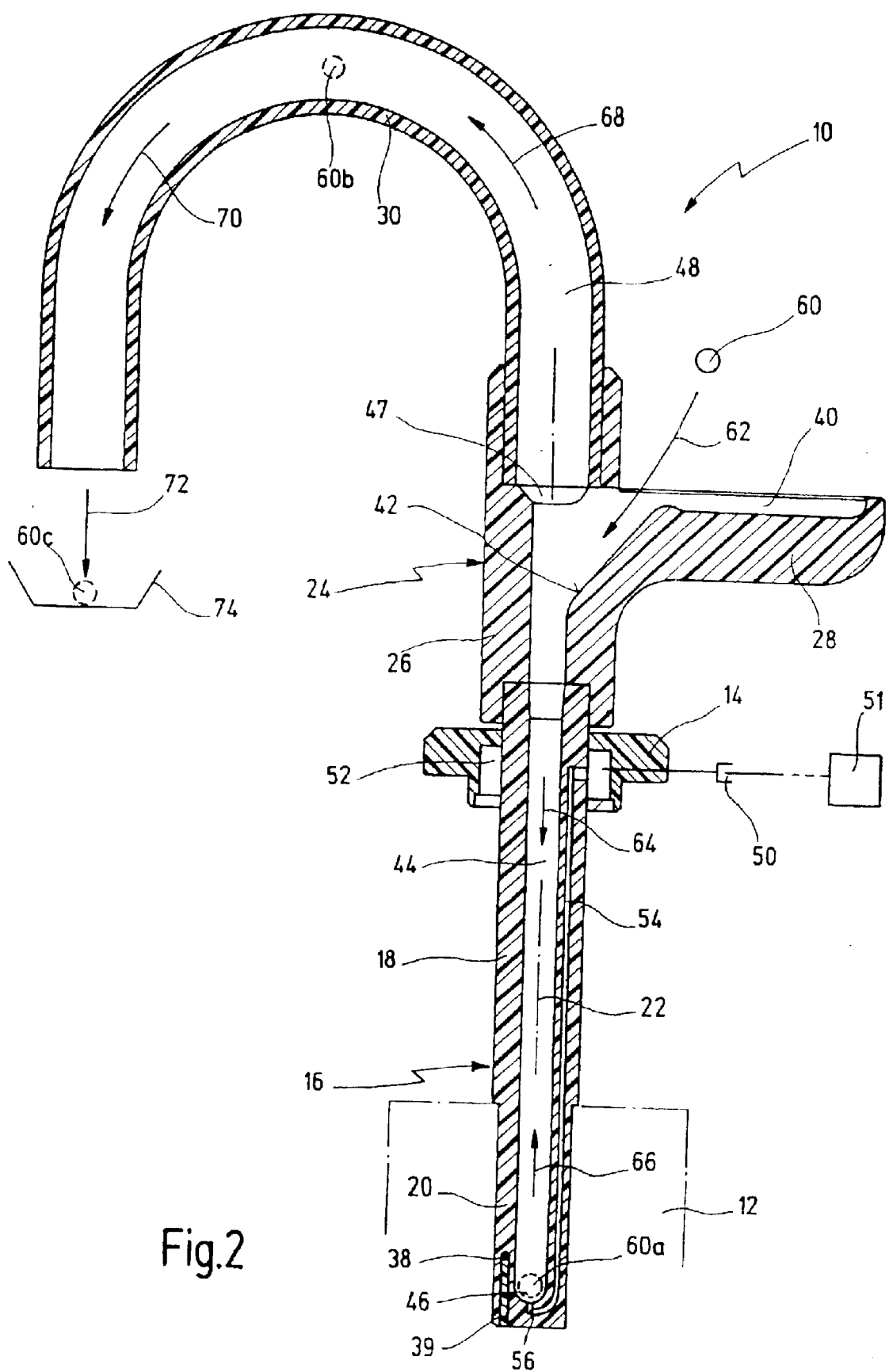
FIG. 2 shows the insert of FIG. 1, in a longitudinal sectional view.

In FIGS. 1 and 2, reference numeral 10 as a whole indicates an insert for an electron spin resonance (ESR) spectrometer. Reference numeral 12 schematically indicates a hollow cavity resonator 12 of conventional design. In the embodiment shown, cavity resonator 12 is a rectangular cavity of the $TE_{102}$ mode of oscillation.

Below a flange 14, insert 10 comprises a lower portion 16 which, in turn, has an upper section 18 and a lower section 20. A common axis 22 (FIG. 2) extending vertically in the mounting position of FIG. 1 defines the extension of lower portion 16 as well as an upper portion 24 extending upwardly from flange 14.

Insert 11 is introduced into cavity resonator 12 in a vertical direction until upper section 18 comes to rest on the upper side of cavity resonator 12. In this defined position, insert 10 is affixed to cavity resonator 12 in a conventional manner. It goes without saying that this operation may be automatized, i.e. may be executed by means of a robot. Interchanging insert 10 may, hence, be made simple and reproducible.

Upper portion 24 is subdivided into a vertical section 26 and a horizontal section 28 extending laterally from vertical section 26. Vertical section 26 has a transition to a tube elbow 30 at its upper side, tube elbow 30 being a 180° elbow in the illustrated embodiment.

Upper section 18 of lower portion 16 is provided with a lateral surface 32. A bar code imprint 34 is applied to that surface 32 being preferably a plane surface. Imprint 34 cooperates with a bar code reader 36 as schematically indicated in FIG. 1 by a double arrow. Bar code reader 36 may be an external reader, however, it will also be possible to integrate bar code reader 36 into cavity resonator 12.

Bar code imprint 34 contains various information as will be explained in further detail below. In particular, it identifies the particular insert 10 with respect to its design. Further, it may contain information about unavoidable base signals generated by insert 10 during subsequent ESR measurements, in order to make it possible to eliminate such base signal from the measurement on a sample to be measured by computation. Finally, imprint 34 may provide information about a reference sample integrated in insert 10 as will also be described in further detail below. Allocation of this type of information may preferably be effected via a reference data file.

In the embodiment shown in FIGS. 1 and 2, reference sample 38 is positioned at the lowermost end of lower section 20. Reference sample 38, for example, may be configured as a small sphere or as a pill and may be molded within a channel 39. It is always located in an optimal relative position with respect to the sample under investigation, i.e. the measurement conditions for both samples are as much identical as possible.

Insert 10 shown in FIGS. 1 and 2 is used for conducting measurements on pill-shaped measuring samples comprising a dosimeter substance. Alanine is preferably used as dosimeter substance, alanine being used in these days in standardized form for measuring irradiation doses (cf. the already above-mentioned U.S. standard E 1607-96 from the American Society for Testing and Materials). Alanine pills are commercially available for that purpose. They are affixed to goods which, for the purpose of sterilization or for other purposes are exposed to an irradiation, wherein documentary evidence shall be created with respect to the irradiation dose exerted on these goods.

Horizontal section 28 on the upper side of insert 10 shown in FIGS. 1 and 2 is provided with an insertion opening 40 being configured as a small vertical slot which, for example, may be provided with a chamfer as a means for assisting insertion. The width of slot 40 is dimensioned such that an alanine pill 60 may just be received by slot 40 in a vertical position. Within vertical section 26 of upper portion 24, there is a transition from slot 40 configured as a chamfered guide 42 via which alanine pill 60 enters into a vertical narrow, i.e. flat, channel 44. The radial cross-sectional area of channel 44 essentially corresponds to the cross-sectional area of alanine pill 60 such that alanine pill 60 is guided within channel 44 by positive engagement when it falls downwardly under the action of gravity.

As indicated at 60a in FIG. 2, the alanine pill finally arrives at bottom 46 of channel 44, serving at the same time as a mechanical stop and, hence, as a reference position.

Insert 10, further, may comprise means (not shown in the drawing) allowing to detect whether at the beginning of an ESR measurement there is actually only one alanine pill 60a in the reference position or whether there is no pill or a plurality of pills due to some malfunction. As an alternative, this may be detected from a shift of the reference frequency.

In order to enable a disposal of alanine pill 60a via elbow 30 after the completion of the ESR measurement, a transition 47 from the flat to a round cross-sectional shape is provided, extending to an interior space 48 of elbow 30. In that area, interior space 48 is flush with channel 44 along axis 22.

A pressurized air connector 50 is provided in the area of flange 14. It is connected with a controllable pressurized air unit 51. Pressurized air connector 50 is connected with an annular space 52 within flange 14. Annular space 52, in turn, is connected to a pressurized air channel 54 extending parallel to channel 44 into lower section 20 of lower portion 16, down to an orifice 56 within bottom 46 of channel 44.

The apparatus is operated as follows:

As already mentioned, alanine pill 60 may be inserted into insertion opening 40 or into the slot in the direction of an arrow 62, preferably manually. Alanine pill 60 will now fall downwardly within vertical channel 44 in the direction of arrow 64, until it reaches bottom 46 at 60a.

After the completion of the ESR measurement, the pressurized air system is activated and compressed air is guided into annular space 52 and pressurized air channel 54, respectively. Accordingly, alanine pill 60a will be blown upwardly from bottom 46 in a vertical direction, as indicated by arrow 66. It now flies along axis 22 upwardly into interior space 48 of elbow 33 and is deflected there, as indicated by arrow 68. The alanine pill within elbow 30 is indicated at 60b in FIG. 2.

As indicated by arrow 70, it is then again deflected vertically downwardly and then (arrow 72) reaches, for example, a collecting container 74 positioned below the exit of elbow 30. In FIG. 2 this is indicated at 60c.

Hence, the guide system for alanine pills 60 is a closed system in itself, so that the interior space of resonator 12 is protected against the intrusion of dust or abraded pill particles.

As already mentioned above, the ESR measurement on alanine pill 60 is conducted for determining a dose of irradiation to which alanine pill 60 had been exposed before.

In this connection it is desired that the dose of irradiation be measured with an accuracy of between 1 and 2%. This is not easily possible with conventional ESR measurements because the amplitude of an ESR signal within a broad range depends on the particular measuring conditions. Among these are not only parameters that may be set externally and reproducibly, as the microwave frequency, the microwave intensity, the modulation amplitude, the amplification factor etc., but also other parameters that may much less be set properly or reproducibly, respectively, as is the case with the properties of the particular resonator, its cooperation with the particular measuring probe, the type and the setting of the coupling between the resonator and the microwave line, etc.

For that reason, insert 10 shown in FIGS. 1 and 2 utilizes a setup with reference sample 38 being utilized as an integrated standard in order to calibrate the measured ESR signal of alanine pill 60.

Considering that the dose of irradiation in today's industrial applications varies in wide ranges in practice, typically between 400 Gy and 100 kGy, reference samples 38 for various ranges of irradiation must be provided. In this context it is also possible to utilize several reference samples of distinct kind in one insert, as will be explained below in connection with FIGS. 6 and 7.

As has already been mentioned, the material from which all components of insert 10 are manufactured, shall have an intrinsic ESR signal being as small as possible, so that the measurement on the sample is not superimposed by a spurious or base signal.

Conventionally utilized dosimeter substances, in particular alanine, have an ESR signal in the area of a gyromagnetic ratio of g=2. The material from which insert 10 is made should, therefore, not have a measurable ESR signal in that range. This is the case, for example, for polyester when used as such material.

The same applies in principle for reference sample 38. The ESR signal of the reference sample shall be significant, however, it should have a sufficient spectral distance from the ESR signal of the dosimeter substance. Apart from that, the reference sample should as much as possible have the same ESR characteristics as the dosimeter substance, i.e. for example, have a comparable line width (i.e. modulation saturation behavior), a comparable microwave saturation behavior, a comparable temperature coefficient, an isotropic behavior, etc.

According to the present invention, a chromium-doped magnesium oxide (Cr:MgO) is utilized as a reference sample. The amount of dotation is preferably 0.1%. The chromium cation $Cr^{3+}$ may be utilized in natural or in isotope clean abundance, as will be explained below.

Figure 3:
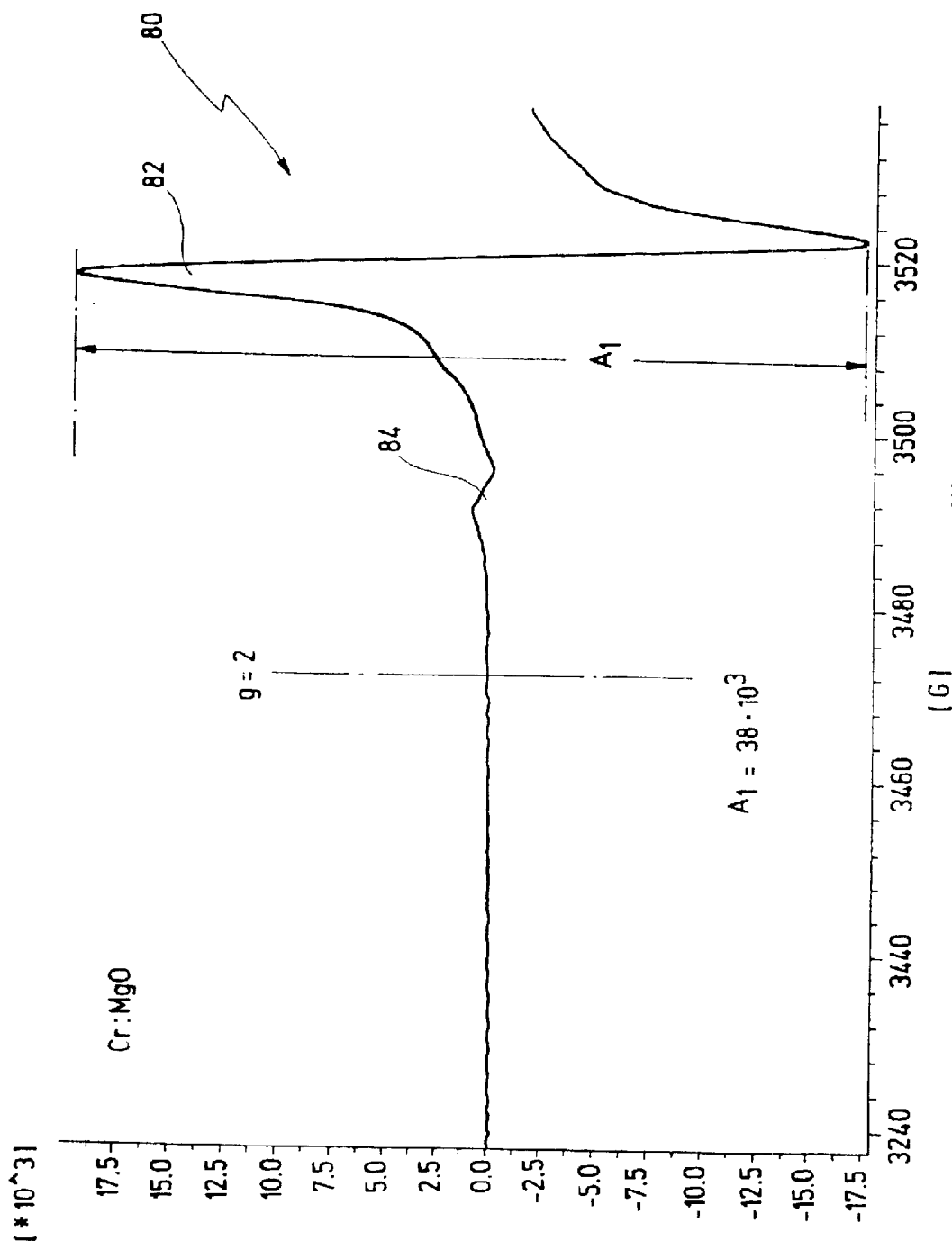
FIG. 3 shows an ESR spectrum of a first reference sample.

FIG. 3 illustrates an ESR spectrum of this sample material for a measurement in X-band, i.e. at a microwave frequency of about 9.8 GHz.

As one may clearly see from FIG. 3, the ESR spectrum of Cr:MgO has a primary line 82 as well as a smaller secondary line 84. Both lines are sufficiently at a distance from the gyromagnetic ratio g=2, i.e. the resonance position of a free electron.

The amplitude $A_1$ of primary line 82, measured from tip to tip, is about $38 \times 10^3$ arbitrary units.

Within the scope of the present invention, one has now found that a considerable improvement may be achieved insofar when instead of Cr:MgO a reference sample is utilized, in which the chromium ions appear as the isotope $^{52}Cr$. In that case, the chromium cation will be used in its isotope clean abundance (>95% $^{52}Cr^{3+}$).

Figure 4:
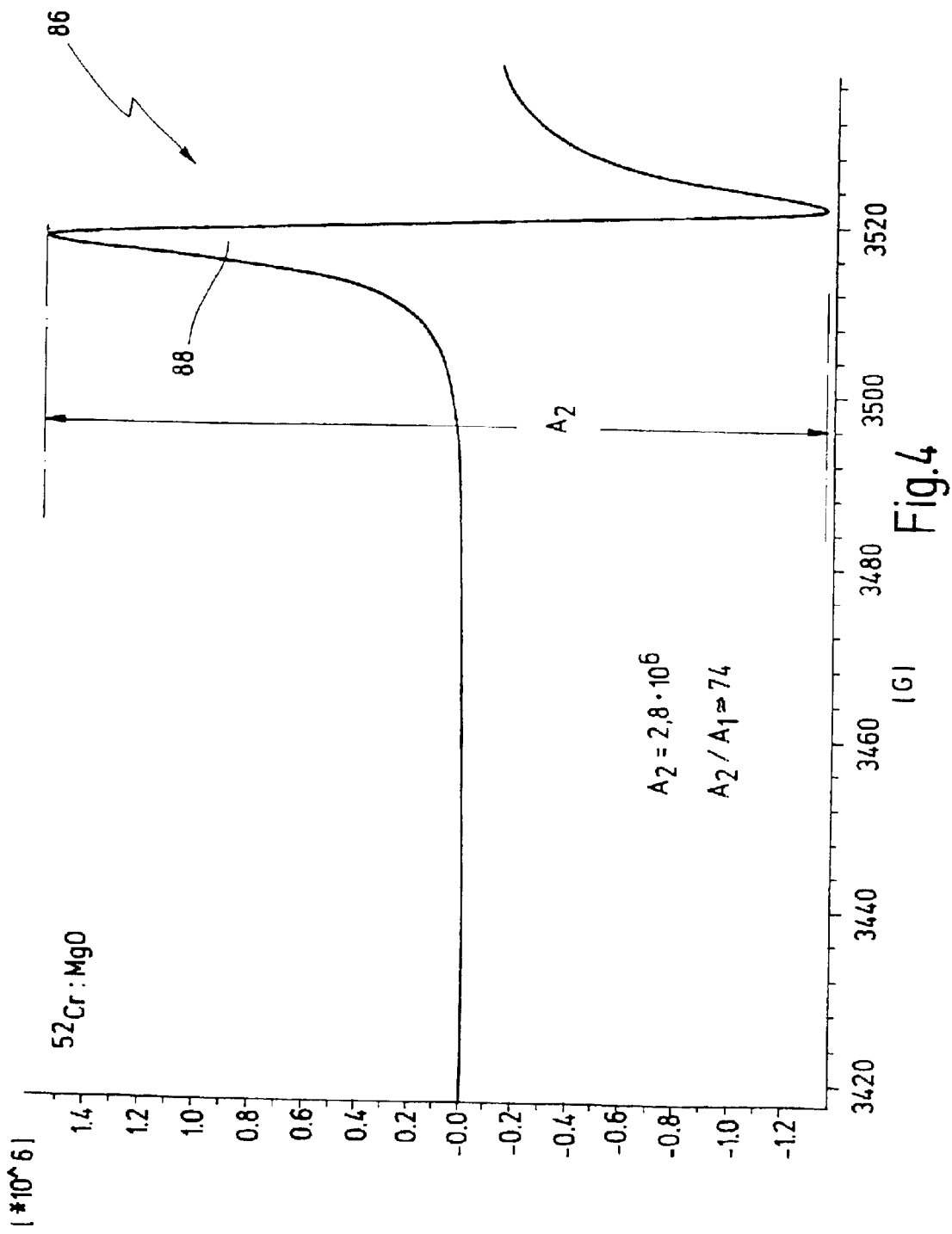
FIG. 4 shows an ESR spectrum of a second reference sample.

FIG. 4, in an analog illustration as compared to FIG. 3, the ESR spectrum 86 of $^{52}Cr:MgO$ is shown. One can see that the spectrum only comprises a primary line 88 but no secondary line. Moreoever, the signal-to-noise ratio is substantially better, as becomes apparent from an amplitude $A_2$ of main line 88 being equal to $2.8 \times 10^6$ arbitrary units. The amplitude ratio $A_2/A_1$ is, therefore, about 74.

$^{52}Cr:MgO$ is, hence, extremely well suited as a reference sample for measurements of the kind of interest in the present context because it has only one distinct primary line 88 within ESR spectrum 86 being sufficiently at a distance from g=2 and, in relation to the amount of sample substance, has a higher amplitude.

Figure 5:
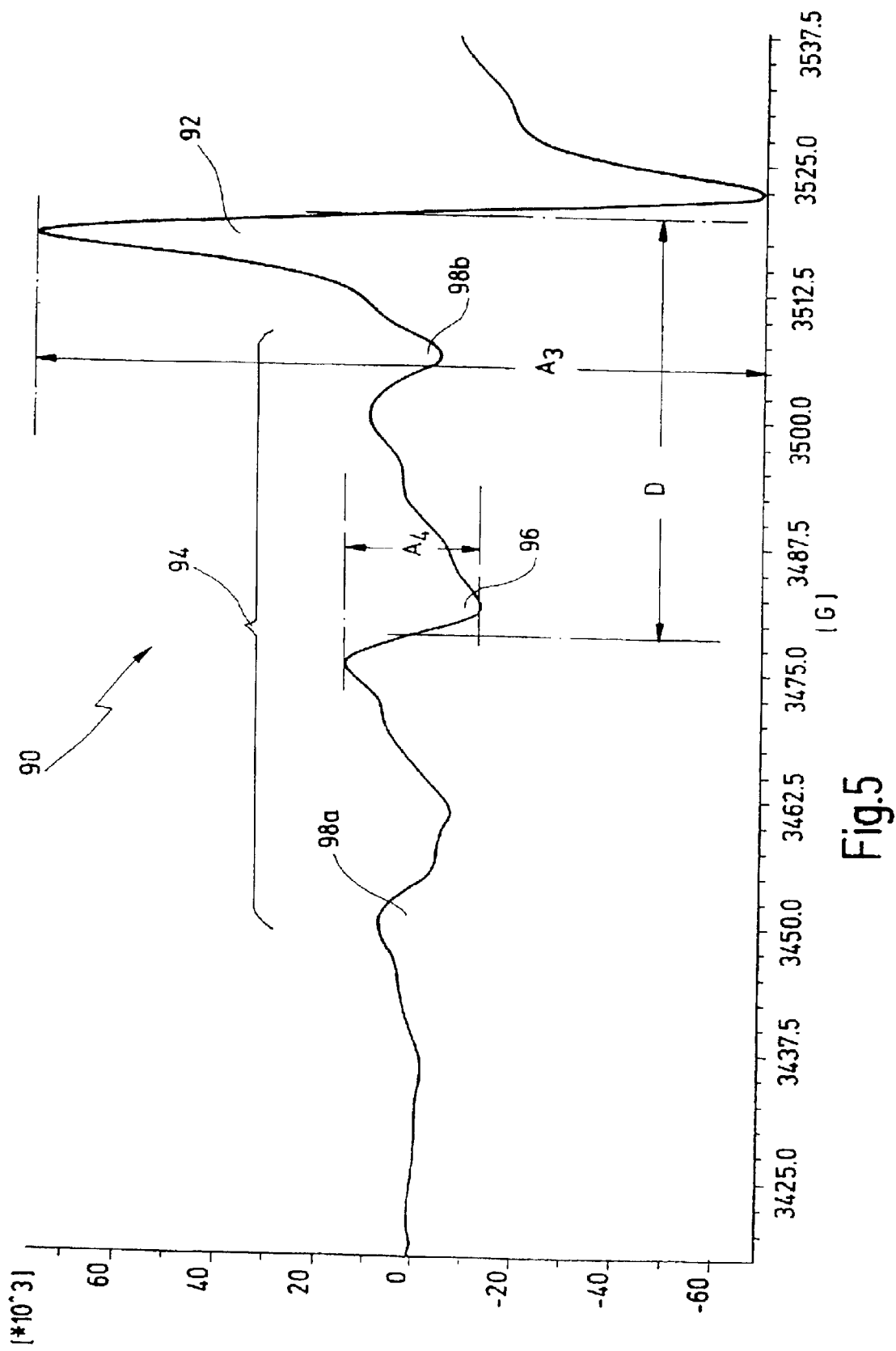
FIG. 5 shows an ESR spectrum comprising ESR signals of a reference sample as well as of a sample comprising a dosimeter substance.

FIG. 5 now shows the dosimetry measurement as such, as may be executed with insert 10 of FIGS. 1 and 2, while utilizing a reference sample 38 according to FIG. 4 or 5.

A third ESR spectrum 90 illustrated in FIG. 5 shows on the right hand side a primary line 92 of reference sample 38, the amplitude of which being indicated with $A_3$. Primary line 92, again, is at a sufficient distance D from position g=2, corresponding to the center of the alanine spectrum 94 which, in turn, consists of a primary line 86 as well as to secondary lines 98a and 98b being located symmetrically thereto.

For calibrating the measured alanine signal which, as already mentioned, is in turn a measure for the irradiation dose exerted on the sample, amplitude $A_4$ of primary line 96 is determined and is set into a relationship to predetermined amplitude $A_3$ of primary line 92 of reference sample 38, being stored in bar code imprint 34. In such a way it is, therefore, possible to calibrate the ESR signal of alanine pill 60 and, hence, determine the dose of irradiation in absolute values (Gy). Further, at this moment in time it is possible to eliminate an intrinsic signal of insert 10, if necessary, which is also stored in bar code imprint 34.

Figure 7:
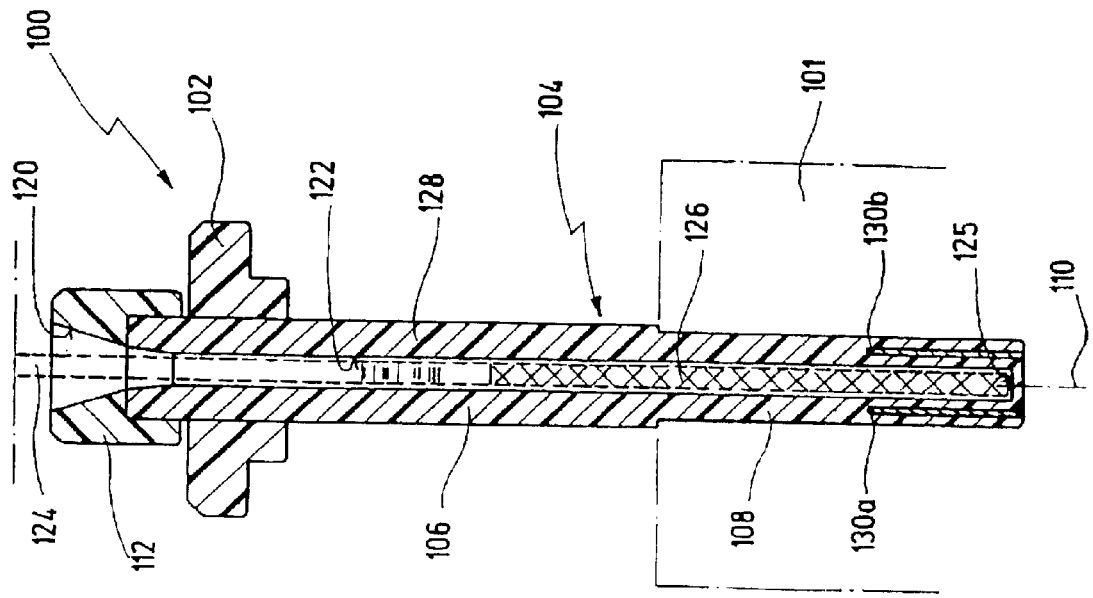
FIG. 7 is an illustration, similar to that of FIG. 2, however for the embodiment of FIG. 6.
Figure 6:
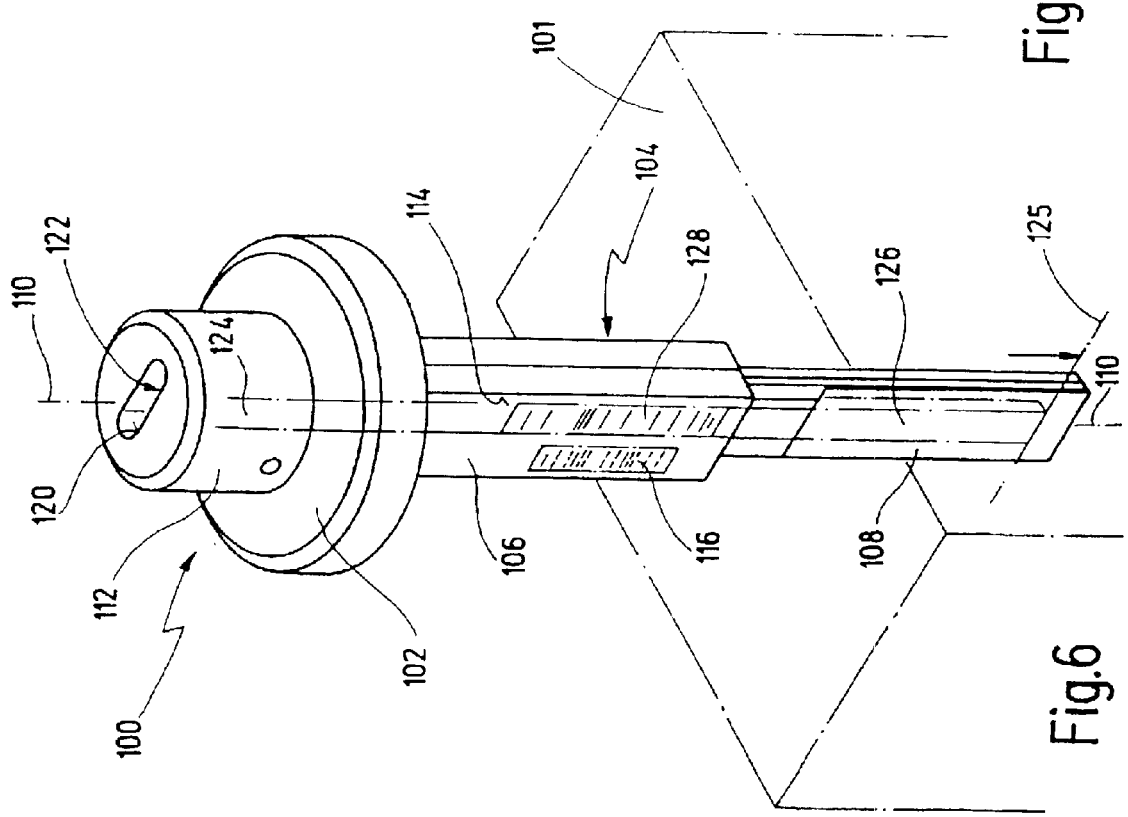
FIG. 6 is an illustration, similar to that of FIG. 1, however, for a second embodiment of an insert for an ESR spectrometer, adapted to be used for strip-shaped alanine dosimeters.

FIGS. 6 and 7 show still another embodiment of an insert 10 for another application, namely for the use of strip-shaped alanine dosimeters.

Insert 100 may be introduced in a hollow cavity resonator 101 which, again, is indicated to be a rectangular resonator. In this case, too, insert 100 is provided with a flange 102.

A lower portion 104 of insert 100 is again subdivided into an upper section 106 which, when insert 100 is introduced, comes to rest on resonator 101, and a lower section 108. The insert 100 may, therefore, be exchanged simply and reproducibly. In the vertical mounting position shown, insert 100 extends along a common axis 110.

An upper portion 112 extends upwardly from flange 102.

A surface 114 of upper section 106 is again provided with a bar code imprint 116 of the kind already explained.

Within the upper side of upper portion 112, there is an insertion opening or assisting means 120 extending to a vertically extending channel 122. Channel 122, again, is of a flat shape, i.e. is essentially rectangular in a radial cross-section. Its shape is adapted to the radial cross-section of a test strip 124 which may be introduced into channel 122 from above with the help of assisting means 120.

The length of test strip 124 is dimensioned such that when it is entirely introduced, it comes to rest on a stop 125 at a reference position at the lower terminal end of channel 122 (cf. FIG. 7), wherein it still protrudes upwardly from upper portion 112, such that test strip 124 may be pulled out manually or automatically, after the measurement is completed.

Within the area of channel 122, test strip 124 is subdivided into a lower area 126 and an upper area 128. Within lower area 126, test strip 124 may be coated with a dosimeter substance, for example an alanine film.

In contrast, upper area 128 is provided with still another bar code imprint which, for example, may indicate the batch number of the irradiated goods, the composition of the dosimeter substance, etc., i.e. data which are necessary for the archives, in particular in the context of a certification.

If insert 100, at least in the area of upper section 106 of lower portion 104, is configured to be optically transparent, bar code imprint 128 may be read from the exterior. For that purpose, one can either provide a corresponding recess within surface 114 of upper section 106 or one can configure upper section 106 as a whole from a transparent material.

In a preferred embodiment, first code imprint 116 may only be read by means of a code reader, when test strip 124 is in a predetermined position, i.e. in a vertical position, and in a predetermined orientation, for example front/back, within guide channel 122.

For that purpose, the optically transparent area of insert 100 may be configured such that first code imprint 116 may only be read by means of a code reader when test strip 124 is within a predetermined position and orientation within guide channel 122.

As one can clearly see from FIG. 6, bar code imprint 128 in the upper area of test strip 124 just lies side-by-side with bar code imprint 116 on upper section 106 of insert 100, when test strip 124 is in the measuring position. Hence, in that condition one can read both bar code imprints 116 and 128 with one and the same bar code reader, as already indicated above in connection with the embodiment shown in FIG. 1.

Finally, insert 100 at the lower terminal end of lower section 108 is provided with a reference sample, wherein in the embodiment shown in FIG. 7, two such reference samples 130*a* and 130*b* are provided in an optimum relative position with respect to lower area 126. These two reference samples may have different amplitudes at different spectral position, in order to be able to use the same insert 100 for test strips 124 of different signal intensity, i.e. different dose of irradiation, for example within a range between 400 Gy and 100 kGy. One has found that in practice for covering this range of doses, two distinctly strong reference samples are sufficient.

What is claimed is:

1. A probehead for an electron spin resonance (ESR) dosimeter, comprising a resonator, and an insert extending into said resonator and having a guide channel for bringing a sample into said resonator, said sample comprising a dosimeter substance, wherein said guide channel is configured for receiving and guiding a test strip.

2. The probehead of claim 1, wherein said test strip consists of a carrier material, said carrier material being coated with said dosimeter substance at least over a section of said test strip.

3. The probehead of claim 1, wherein said test strip is provided with a first machine-readable code imprint.

4. The probehead of claim 3, wherein said first code imprint is readable by means of a code reader only when said test strip is in a predetermined position and in a predetermined orientation within said guide channel.

5. The probehead of claim 1, wherein said insert is provided with a second machine-readable code imprint.

6. The probehead of claim 1, wherein said test strip is provided with a first machine-readable code imprint, and said insert is provided with a second machine-readable code imprint, said first and second code imprints being located side by side when said test strip is inserted into said guide channel, said insert being configured optically transparent at least in an area adjacent said first code imprint.

7. The probehead of claim 6, wherein said optically transparent area is located such that said first code imprint can be read only when said test strip is in a predetermined position and in a predetermined orientation within said guide channel.

8. The probehead of claim 1, wherein said test strip is provided with a first machine-readable code imprint, and said insert is provided with a second machine-readable code imprint, said code imprints being adapted to be read by one common code reader.

9. The probehead of claim 1, wherein said guide channel is provided with a stop for said test strip.

10. The probehead of claim 9, wherein said stop is configured by a lower terminal end of said guide channel, said guide channel extending vertically.

11. The probehead of claim 1, wherein said guide channel is provided with an assisting means for inserting said test strip into said guide channel.

12. The probehead of claim 1, wherein said insert is provided with at least one reference sample, said reference sample being positioned within said insert such that said reference sample is located essentially at a position of said section coated with said dosimeter substance, when said test strip is inserted into said guide channel.

13. The probehead of claim 1, wherein said dosimeter substance is alanine.

14. The probehead of claim 1, wherein the sample comprises a chromium-doped magnesium oxide (Cr:MgO), wherein said magnesium oxide is doped with an isotope $^{52}$Cr.

15. The probehead of claim 14, wherein said isotope $^{52}$Cr is used in an isotope-pure abundance (>95%).

16. The probehead of claim 14, wherein a fraction of said isotope $^{52}$Cr within said doped magnesium oxide ($^{52}$Cr:MgO) is between 0.05 and 0.15%.

17. The probehead of claim 16, wherein said fraction is 0.1%.

18. A probehead for an electron spin resonance (ESR) dosimeter, comprising a resonator, and an insert extending into said resonator and having a guide channel for bringing a sample into said resonator, said sample comprising a dosimeter substance, wherein said insert is provided with a first machine-readable code imprint.

19. The probehead of claim 18, wherein a code reader is associated to said first code imprint.

20. The probehead of claim 19, wherein said first and second code imprints are located side by side when said sample is inserted into said resonator, said insert being configured optically transparent at least in an area adjacent said second code imprint.

21. The probehead of claim 20, wherein said optically transparent area is located such that said first code imprint can be read only when said test strip is in a predetermined position and in a predetermined orientation within said guide channel.

22. The probehead of claim 18, wherein said sample is provided with a second machine-readable code imprint.

23. The probehead of claim 18, wherein said first code imprint is readable by means of a code reader only when said test strip is in a predetermined position and in a predetermined orientation within said guide channel.

24. The probehead of claim 18, wherein said sample is provided with a second machine-readable code imprint, said first and second code imprints being adapted to be read by one common code reader.

25. A probehead for an electron spin resonance (ESR) dosimeter, comprising a resonator, and an insert extending into said resonator and having a guide channel for bringing a sample into said resonator, said sample comprising a dosimeter substance, wherein said insert is provided with at least one reference sample.

26. The probehead of claim 25, wherein said reference sample is positioned within said insert such that said reference sample is located in an area adjacent a volume of said sample to be measured, when said sample is inserted into said guide channel.

27. The probehead of claim 26, wherein said guide channel extends vertically within said insert, a stop for said sample being provided at a lower terminal end of said guide channel, said reference sample being arranged essentially at said stop.

28. The probehead of claim 25, wherein said reference sample generates an ESR signal having a spectral position distant from an ESR signal generated by said dosimeter substance.

29. The probehead of claim 25, wherein said reference sample generates an ESR signal having a microwave saturation behavior corresponding to a microwave saturation behavior of said dosimeter substance.

30. The probehead of claim 25, wherein said reference sample generates an ESR signal having a line width corresponding to a line width of said dosimeter substance.

31. The probehead of claim 25, wherein said reference sample generates an ESR signal having a temperature coefficient corresponding to a temperature coefficient of said dosimeter substance.

32. The probehead of claim 25, wherein said dosimeter substance is alanine.

33. The probehead of claim 25, wherein said reference sample consists of chromium-doped magnesium oxide.

34. The probehead of claim 33, wherein said reference sample consists of $^{52}$Cr:MgO.

35. A probehead for an electron spin resonance (ESR) dosimeter, comprising a resonator, an insert extending into said resonator and having a guide channel for bringing a sample into said resonator, said sample comprising a dosimeter substance, and a pressurized air unit for blowing said sample out of said resonator after completion of a measurement, wherein said insert has an opening on an upper side of said resonator, said opening being openly accessible for manually inserting dosimeter pills thereinto, said insert, further, being provided on said upper side with a pressurized air connector, said pressurized air connector being connected to an orifice via a pressurized air channel within said insert, said orifice being located within a lower, otherwise closed bottom of said guide channel.

36. The probehead of claim 35, wherein said guide channel has a rectangular cross-section.

37. The probehead of claim 36, wherein said opening is configured as a slot.

38. The probehead of claim 37, wherein said opening is arranged at a lateral distance from said guide channel and has a transition into said guide channel via a chamfered guide means.

39. The probehead of claim 35, wherein said guide channel has an upper end and a transition into a blow-out channel at said upper end.

40. The probehead of claim 39, wherein said blow-out channel is configured as a tube elbow.

41. The probehead of claim 40, wherein said tube elbow is configured as a 180° elbow.

42. The probehead of claim 35, wherein said insert has a bottom and is provided with a reference sample essentially at said bottom.

43. The probehead of claim 42, wherein at least two reference samples with distinct gyromagnetic ratios are provided essentially at said bottom.

44. The probehead of claim 35, wherein said insert is provided with a machine-readable code imprint.

* * * * *